United States Patent
Lakshmikumar et al.

(10) Patent No.: US 10,819,299 B2
(45) Date of Patent: Oct. 27, 2020

(54) PROCESS AND TEMPERATURE INSENSITIVE LINEAR CIRCUIT

(71) Applicant: Cisco Technology, Inc., San Jose, CA (US)

(72) Inventors: Kadaba Lakshmikumar, Basking Ridge, NJ (US); Alexander Christopher Kurylak, Bethlehem, PA (US); Manohar Nagaraju, East Norriton, PA (US); Richard Van Hoesen Booth, Riegelsville, PA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/675,629

(22) Filed: Nov. 6, 2019

(65) Prior Publication Data
US 2020/0076390 A1 Mar. 5, 2020

Related U.S. Application Data

(63) Continuation of application No. 15/798,471, filed on Oct. 31, 2017, now Pat. No. 10,505,509.

(51) Int. Cl.
*H03F 3/08* (2006.01)
*H03G 3/30* (2006.01)
(Continued)

(52) U.S. Cl.
CPC ............... *H03G 3/30* (2013.01); *G05F 1/46* (2013.01); *H03F 1/0233* (2013.01); *H03F 1/30* (2013.01);
(Continued)

(58) Field of Classification Search
CPC ...... H03G 3/30; H03G 1/0023; H03G 1/0029; H03G 1/0035; H03G 1/0088; H03G 3/00;
(Continued)

(56) References Cited

U.S. PATENT DOCUMENTS 5,532,471 A 7/1996 Khorramabadi et al.
5,714,909 A 2/1998 Jackson
(Continued)

FOREIGN PATENT DOCUMENTS

WO 00/31867 6/2000

OTHER PUBLICATIONS

A. Cevrero, et al., "A 64Gb/s 1.4pJ/b NRZ Optical-Receiver Data-Path in 14nm CMOS FinFET", ISSCC 2017 / Session 29 / Optical- and electrical-Link Innovations / 29.1, 2017 IEEE International Solid-State Circuits Conference, Feb. 8, 2017, 3 pages.
(Continued)

*Primary Examiner* — Khanh V Nguyen
(74) *Attorney, Agent, or Firm* — Edell, Shapiro & Finnan, LLC

(57) ABSTRACT

A circuit includes a front end section configured to receive input current signals; a programmable gain amplifier section coupled to the front end section, the programmable gain amplifier section including a plurality of inverters connected in series without a resistor disposed therebetween; and an output buffer section coupled to the programmable gain amplifier section and configured to output voltage signals.

20 Claims, 10 Drawing Sheets

(51) Int. Cl.
*H03F 1/02* (2006.01)
*H03K 3/03* (2006.01)
*H03F 1/30* (2006.01)
*G05F 1/46* (2006.01)
*H03G 1/00* (2006.01)
*H03L 7/08* (2006.01)

(52) U.S. Cl.
CPC ......... *H03G 1/0088* (2013.01); *H03K 3/0315* (2013.01); *H03F 2200/468* (2013.01); *H03F 2200/78* (2013.01); *H03F 2203/45288* (2013.01); *H03L 7/0807* (2013.01)

(58) Field of Classification Search
CPC ..... H03G 2201/10; G05F 1/46; H03F 1/0233; H03F 2200/78; H03F 2203/45288; H03F 2200/468; H03F 1/30; H03F 3/45; H03F 3/45183; H03L 7/0807; H03K 3/0315
USPC .............. 330/59, 254, 278, 308; 250/214 A, 250/214 AG
See application file for complete search history.

(56) References Cited

U.S. PATENT DOCUMENTS

| | | | |
|---|---|---|---|
| 6,037,841 A | 3/2000 | Tanji et al. | |
| 6,084,478 A | 7/2000 | Mayampurath | |
| 6,140,878 A | 10/2000 | Masuta | |
| 6,404,281 B1 | 6/2002 | Kobayashi | |
| 6,538,245 B1 | 3/2003 | Kozlowski | |
| 6,720,826 B2 | 4/2004 | Yoon | |
| 6,720,830 B2 | 4/2004 | Andreou et al. | |
| 6,737,924 B1 | 5/2004 | Paillet et al. | |
| 6,771,132 B1 | 8/2004 | Denoyer et al. | |
| 6,778,021 B2 | 8/2004 | Denoyer et al. | |
| 7,205,845 B2 | 4/2007 | Harms et al. | |
| 7,236,056 B2 | 6/2007 | Chang et al. | |
| 7,562,581 B2 | 7/2009 | Garverick et al. | |
| 7,605,660 B1 | 10/2009 | Kobayashi | |
| 8,445,832 B2 | 5/2013 | Takemoto et al. | |
| 8,729,452 B2 | 5/2014 | Tatsumi | |
| 8,970,300 B2 | 3/2015 | Piepenstock et al. | |
| 9,325,557 B2 | 4/2016 | Hayashi et al. | |
| 9,762,186 B2 | 9/2017 | Kim | |
| 9,819,422 B2 | 11/2017 | Guckenberger | |
| 2002/0067838 A1 | 6/2002 | Kindred et al. | |
| 2002/0089728 A1 | 7/2002 | Kim | |
| 2005/0218299 A1 | 10/2005 | Olsen et al. | |
| 2006/0290432 A1* | 12/2006 | Chang ................. H03F 3/45973 330/308 |
| 2007/0139118 A1 | 6/2007 | Teo et al. | |
| 2010/0013563 A1* | 1/2010 | Kim ..................... H03L 7/0995 331/8 |
| 2015/0071654 A1 | 3/2015 | Morita | |

OTHER PUBLICATIONS

A. Awny, et al., "A Dual 64Gbaud 10kΩ 5% THD Linear Differential Transimpedance Amplifier with Automatic Gain Control in 13 μm BiCMOS Technology for Optical Fiber Coherent Receivers", ISSCC 2016 / Session 23 / Electrical and Optical Link Innovations / 23.5, 2016 IEEE International Solid-State Circuits Conference, Feb. 3, 2016, 3 pages.

G. Kalogerakis, et al., "A Quad 25Gb/s 270mW TIA in 0.13 μ BiCMOS with <0.15dB Crosstalk Penalty", ISSCC 2013 / Session 7 / Optical Transceivers and Silicon Photonics / 7.1, 2013 IEEE International Solid-State Circuits Conference, Feb. 19, 2013, 3 pages.

D. Ferenci, et al., "A Highly Linear Transimpedance Amplifier in InP Technology for Application in 100 Gbit/s Fiber Optical Data Communication", Proceedings of the 8th European Microwave Integrated Circuits Conference, Oct. 3-8, 2013, Nuremberg, Germany, 4 pages.

Invitation to Pay Additional Fees and Partial International Search Report in counterpart International Application No. PCT/US2018/057633, dated Feb. 7, 2019, 16 pages.

\* cited by examiner

PGA-C

PGA-F

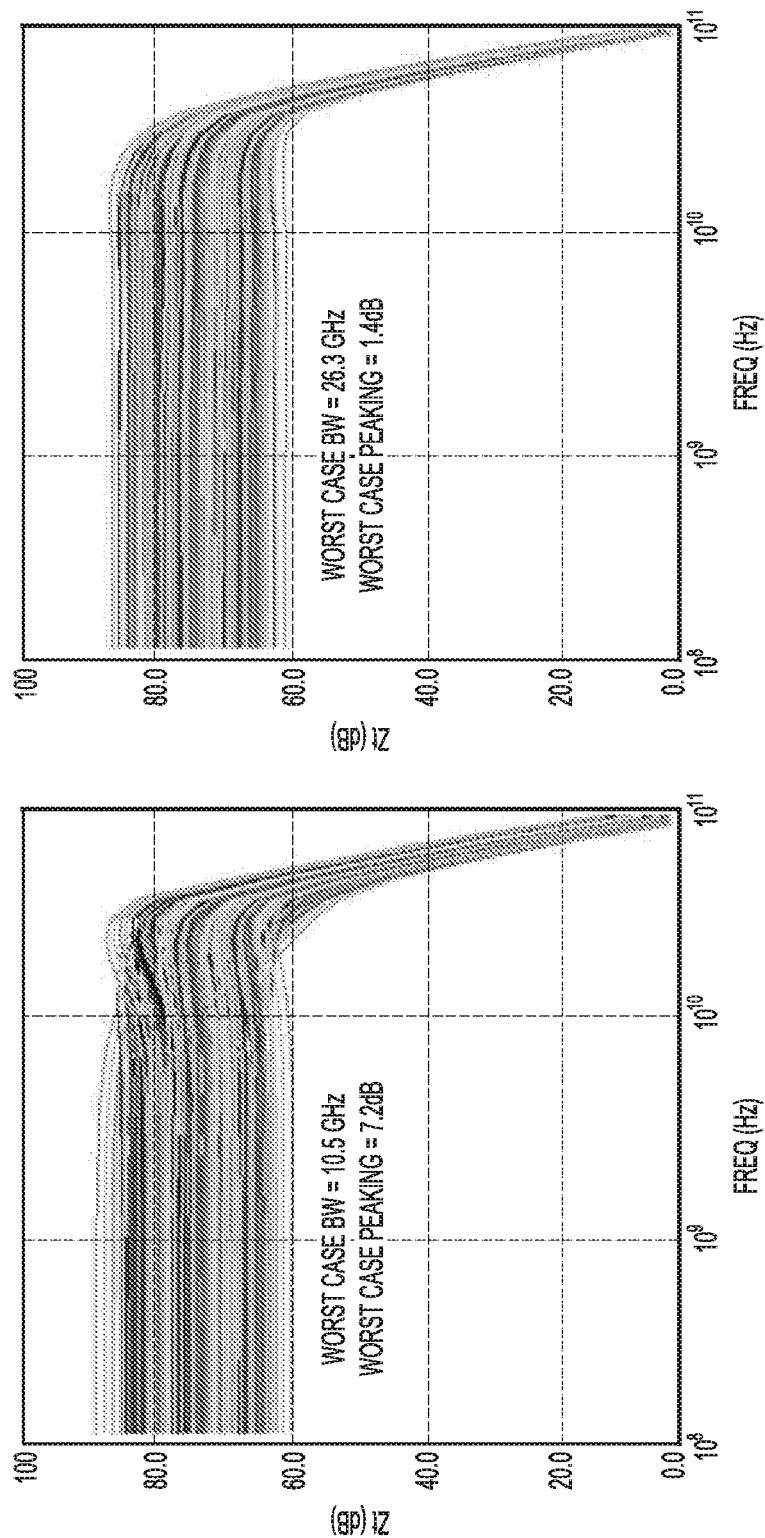

PROCESS AND TEMPERATURE INSENSITIVE LINEAR CIRCUIT

CROSS REFERENCE TO RELATED APPLICATION

This application is a continuation of U.S. Non-Provisional application Ser. No. 15/798,471, filed Oct. 31, 2017, which is incorporated herein by reference in its entirety.

TECHNICAL FIELD

The present disclosure relates to a process and temperature insensitive linear circuit, the circuit topologies and design techniques of which may be applied to a transimpedance amplifier and other applications.

BACKGROUND

Optical links are replacing electrical interconnects in data center infrastructure. Optical links support much higher data rates compared to electrical ones. Optical links also consume a fraction of the power of conventional electrical links. The latest push is to transport at least 100 Gbps on a single wavelength of light. At such rates, the bandwidth of the popular binary NRZ (non-return-to-zero) signaling scheme is too large to be supported by the electrical-to-optical and optical-to-electrical interfaces. Advanced modulation techniques are useful to reduce the required bandwidth. One such technique is pulse-amplitude-modulation with four levels (PAM-4). Two bits are encoded into one of four levels. As a result, the symbol rate (baud rate) will be half of the bit rate and the bandwidth requirement is reduced compared to NRZ signaling. One aspect of this approach is, however, that the signal processing circuits have to be linear. This is a challenge in low-voltage complementary metal-oxide-semiconductor (CMOS) processes. A fine-linewidth CMOS process offers very high speed transistors, but the operating voltage is typically 1 V or less. In order to preserve clearly discernable and equally spaced four levels, the signal processing circuits should exhibit high-linearity and low-noise.

A transimpedance amplifier (TIA) is an element used in converting optical signals to electrical. High-bandwidth linear TIAs are often realized in Indium Phosphide (InP) or Silicon Germanium (SiGe) BiCMOS (Bi-complementary metal-oxide-semiconductor) technologies, where the bipolar transistors offer high speed, low noise, and sustain high voltages. However, the signal processing and logic requirement of a monolithic transceiver integrated circuit (IC) are best realized in CMOS technology. A linear TIA designed in a fine-line CMOS process is likely to face the major technological challenges of signal compression due to limited supply voltage.

BRIEF DESCRIPTION OF THE DRAWINGS

FIGS. 5A and 5B are diagrams showing simulation results of transimpedance amplifiers without a dynamic voltage scaling scheme and with a dynamic voltage scaling scheme, according to an example embodiment.

DESCRIPTION OF EXAMPLE EMBODIMENTS

Overview

In one embodiment, a circuit for a linear transimpedance amplifier is provided. The circuit includes a front end section configured to receive input current signals and a programmable gain amplifier section coupled to the front end section. The programmable gain amplifier section including a plurality of inverters connected in series without a resistor disposed therebetween. An output buffer section is coupled to the programmable gain amplifier section and configured to output voltage signals.

EXAMPLE EMBODIMENTS

There are several challenges in building a high-speed linear transimpedance amplifier (TIA) in a low-voltage CMOS process. One consideration is the low signal swing imposed by the low supply voltage that can be used. As the signal swing increases, the distortion increases rapidly. Negative feedback cannot be used to improve the linearity because the loop-gain will be very low at the frequencies of interest (~30 GHz). Added to this conundrum is the wide dynamic range of the input. At low input levels, the signal-to-noise ratio (SNR) is limited by the noise generated by the TIA. Even after achieving a low input-referred noise, the TIA output should be large enough to overcome the quantization noise of the following A/D converter that is in the link. A large swing in a low-voltage technology using conventional techniques would be very non-linear. When the input signal is large, the non-linearity becomes worse. Therefore, a low-noise, wide dynamic range, high gain-bandwidth, linear TIA is quite useful. There are several functional blocks that are in the TIA, and each one of them has to be optimally designed for gain, bandwidth, noise, and linearity, as discussed hereafter.

Figure 1:
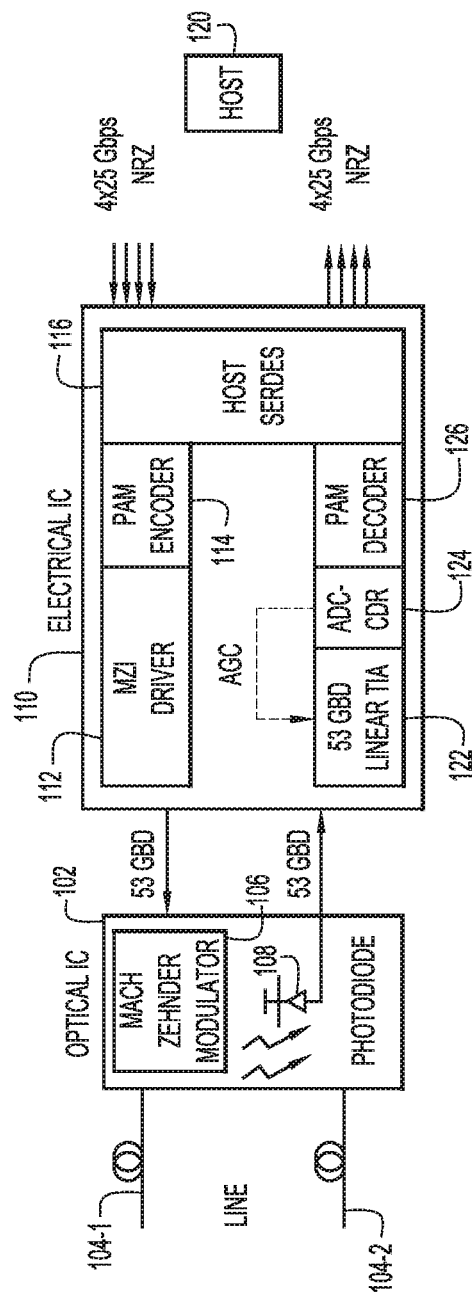
FIG. 1 is a block diagram depicting an optical transceiver that includes a linear transimpedance amplifier, according to an example embodiment.

FIG. 1 is a block diagram of an optical transceiver 100 in which a linear TIA may be employed, according to an example embodiment. An optical transceiver is only one example of the use of a linear TIA according to the embodiments presented herein. The optical transceiver 100 includes an optical integrated circuit (IC) 102 coupled to one or more optical fibers (lines). The optical lines shown in FIG. 1 include an output line 104-1 configured to forward optical signals from the optical IC 102 and an input line 104-2 configured to forward optical signals to the optical IC 102. The optical IC 102 includes an electro-optic modulator 106 and a photodiode 108. In one embodiment, the electro-optic modulator 106 may be a Mach-Zehnder modulator that outputs, for example, a 53.125 GBd PAM-4 optical signal.

The photodiode 108 is configured to convert a PAM-4 optical signal to a current signal.

The optical transceiver 100 further includes an electrical IC 110 coupled to the optical IC 102. On the transmit side, the electrical IC 110 includes an electro-optic interferometer driver 112 configured to drive electro-optic modulator 106, a PAM encoder 114, and host serializer/deserializer (SERDES) 116 configured to transmit or receive NRZ signals from a host 120. The electro-optic interferometer driver 112 may be a Mach-Zehnder Interferometer (MZI) driver in one example. On the receive side, the electrical IC 110 includes a TIA 122, a clock and data recovery (CDR) circuit 124, and a PAM decoder 126. The TIA 122 is a linear TIA configured to convert the current signals received from the photodiode 108 to voltage signals and amplify the voltage signals. In one embodiment, the TIA 122, produced in a CMOS process, may tolerate, for a 100 Gbps/λ link, up to 5% THD (total harmonic distortion) or less than 2% THD to produce four equally spaced levels.

In one embodiment, the optical transceiver 100 is a transceiver system-in-package (SiP) including the electrical IC 110 with a monolithically integrated TIA, flip-chipped on the optical IC 102.

Figure 2:
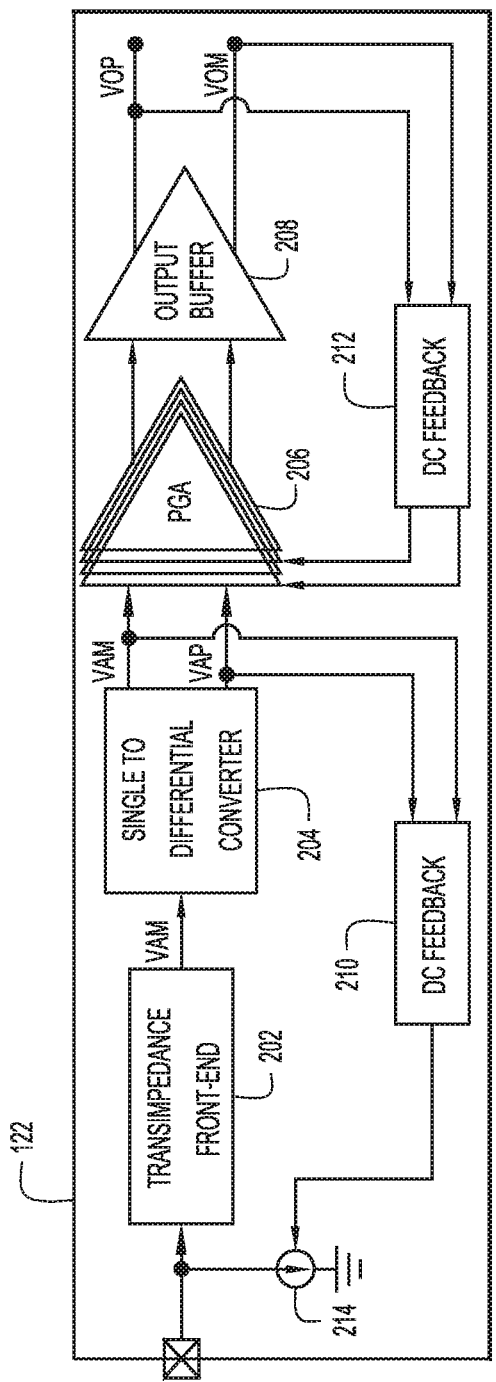
FIG. 2 is a high-level block diagram of the transimpedance amplifier, according to an example embodiment.

FIG. 2 is a block diagram of the linear TIA 122 according to an example embodiment. The linear TIA 122 includes a transimpedance front end section 202, a single-to-differential converter 204, a programmable gain amplifier (PGA) section 206, and an output buffer section 208. The front end section 202 of the TIA 122 may be a current-to-voltage (I/V) converter. The front end section 202 is configured to receive and convert the current output of the photodiode 108 (FIG. 1) to a voltage signal. Because the photodiode current is inherently single ended, the output of the front end section 202 is also single ended. Thus, in some embodiments, the single-to-differential converter 204 is employed to receive the voltage signal VAM from the front end section 202 and to generate a complementary signal VAP. The PGA section 206 is configured to receive and amplify the complementary voltage signals VAM and VAP. The output buffer section 208 is configured to couple to the PGA section 206 to receive the amplified voltage signals and provide a desired impendence for outputting voltages signals VOP and VOM to an analog-digital converter (ADC) in the CDR 124 (FIG. 1).

In some embodiments, the linear TIA 122 may further include a first DC feedback circuit 210 and a second DC feedback circuit 212. The first feedback circuit 210 is coupled between a current source 214 of the TIA 122 and an output of the single-to-differential converter 204. The first feedback circuit 210 is configured to subtract the average value of the photodiode current received from the photodiode 108. The second feedback circuit 212 is coupled between an output of the output buffer section 208 and a first stage of the PGA section 206. The second feedback circuit 212 is configured to minimize the random mismatch effects and prevent saturation of the gain stages in the TIA 122.

Figure 3A:
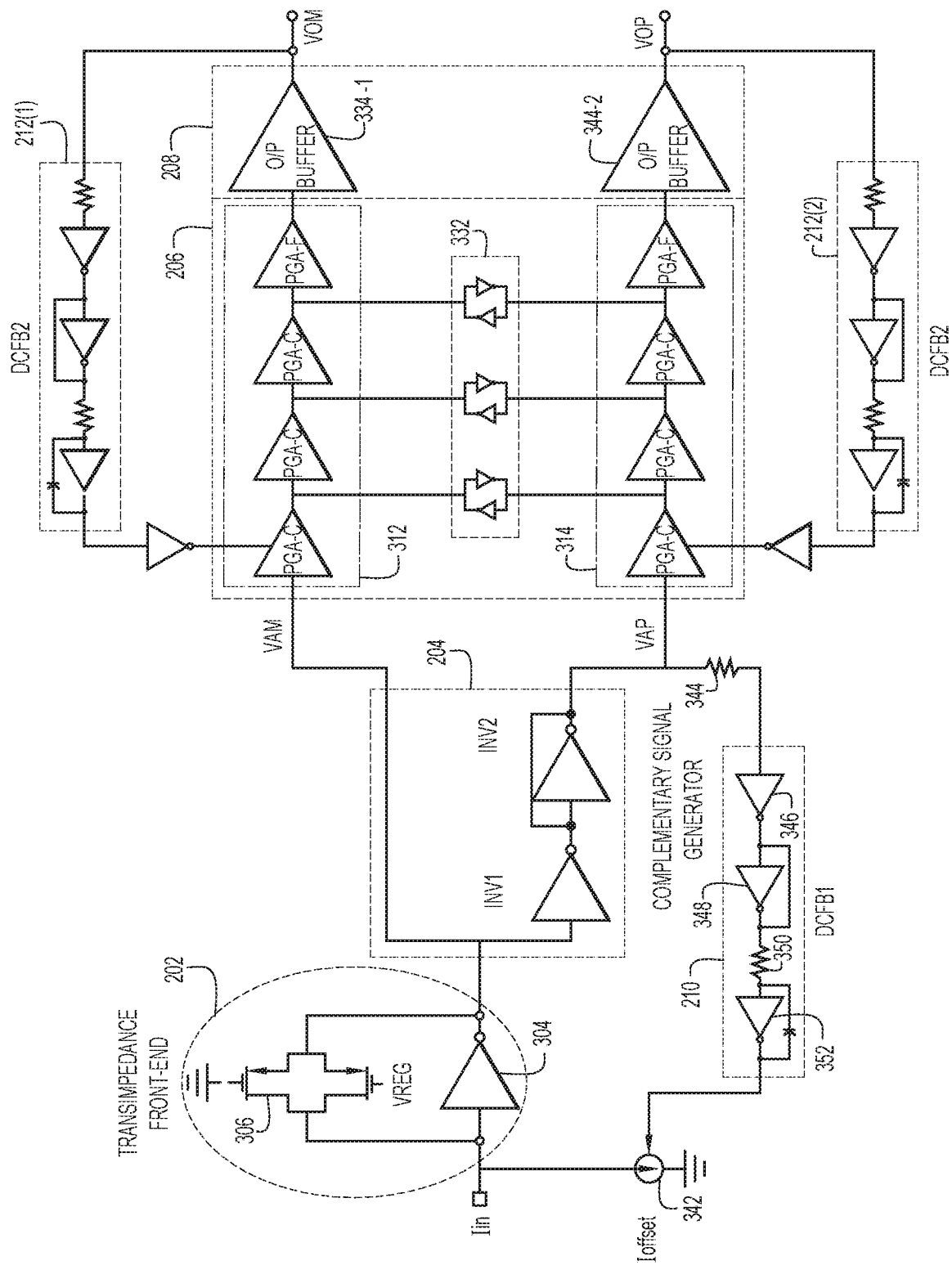
FIG. 3A is a schematic diagram of the transimpedance amplifier, according to an example embodiment.

FIG. 3A is a detailed schematic diagram illustrating an implementation of the linear TIA 122 according to one example embodiment. The transimpedance front end section 202, in one implementation, includes a shunt-feedback inverter 304. The shunt-feedback inverter 304 converts the current output $I_{in}$ of a photo-detector, e.g., photodiode 108 in FIG. 1, to a voltage. The resistive component in the feedback loop of the front end section 202 may be a MOS device 306 operating in triode region (ohmic mode) to reduce parasitics and achieve a higher bandwidth as compared to a programmable poly-resistor. The MOS device 306 can also save valuable real estate area on a chip. The output of the transimpedance front end section 202 is a voltage signal VAM, which is single-ended voltage signal. As the analog-to-digital (ADC) process uses a differential (or balanced) input, the single-ended signal may be converted into a differential or balanced form.

The single-ended voltage signal VAM is fed to the single-to-differential converter 204. The single-to-differential converter 204 is a complementary signal generator configured to generate a complementary signal VAP from voltage signal VAM. A single-to-differential converter is perhaps the most challenging block in terms of linearity. Prior art single-to-differential converters typically use a differential pair where the output of the I/V converter is applied to one of the inputs of the differential pair while the other input is connected to an AC ground (a suitable DC voltage). Such a circuit produces a balanced differential output only when the tail current source is ideal (infinite impedance) and when the input is small enough that the differential pair does not fully steer the tail current all to one side or the other. For a realistic range of signals from the I/V converter, the differential output can be highly non-linear. Source degeneration techniques would not work well when the input to the differential pair is single ended. Also, the tail current source is far from ideal. Techniques like simple cascoding or gain-boosted cascoding are effective only at low frequencies. Thus, the current source has a fairly low impedance particularly at high frequencies. This causes the current value to change as a function of the input signal. The effect of having a signal dependent bias current is that the output is non-linear.

To solve these issues, as illustrated in FIG. 3A, in one form, the single-to-differential converter 204 includes a first inverter INV1 coupled in series to a second inverter INV2 that has a short-circuit connection from its output to its input. The first inverter INV1 serves as a driver that drives a load of the short-circuited second inverter INV2 to generate the complementary signal VAP. The first inverter INV1 has an input coupled to the front end section 202 and an output coupled to an input of the second inverter INV2. The second inverter INV2 has an output coupled to a PGA section 206. The amplitude of the complementary signal VAP is determined by the ratio of the sizes of the driving (INV1) and load (INV2) inverters, and hence can be very tightly controlled. In one embodiment, the sizes of the first inverter INV1 and the second inverter INV2 can be similar or the same. In another embodiment, the size of the load inverter INV2 is smaller than that of the driving inverter INV1 to obtain a gain of unity. The single-to-differential converter 204 is configured to generate a 180 degree out of phase signal VAP from input signal VAM. Any additional phase shift of the complementary path is very small as the pole frequency is near the transit frequency ($f_T$) of the devices. Because the gain of the single-to-differential converter 204 is mostly influenced by a ratio of the transconductances of the driver inverter INV1 and the load inverter INV2, the gain is independent of process and temperature variations. This single-ended to differential arrangement is precise because the amplitude and phase of the signals do not have any resistor dependency, as the single-to-differential converter 204 includes no resistor. However, other forms of single-to-differential converter 204, such as a trans-admittance transimpedance (TAS-TIS) circuit that includes resistor components, may be employed.

Figure 3B:
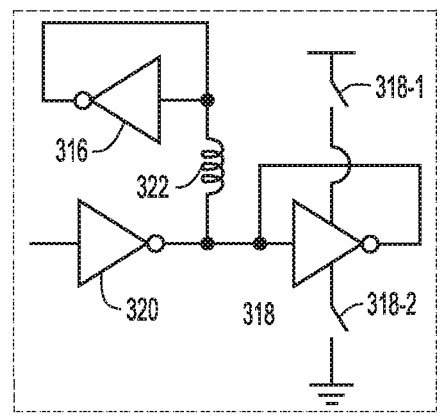
FIG. 3B is a schematic diagram of a coarse programmable gain stage, according to an example embodiment.

The PGA section 206 includes a first signal path 312 and a second signal path 314 that receive the complementary voltage signals VAM and VAP, respectively. Each of the first signal path 312 and the second signal path 314 has a plurality of inverters connected in series without a resistor disposed therebetween. The first signal path 312 is coupled directly after the front end section 202, while the second signal path 314 is coupled directly after the single-to-differential converter 204. For example, each of the first signal path 312 and the second signal path 314 may include a cascade of 3 coarse (e.g., 0 or 5 dB) programmable gain stages (PGA-C) and a fine gain stage with, e.g., 0.5 dB steps (PGA-F). However, the number of connected inverters are not so limited and other numbers of PGA-C and PGA-F may be employed. A more detailed view of a coarse programmable gain stage PGA-C is shown in FIG. 3B. A load in PGA-C is a fixed shorted inverter 316 in parallel with a switchable-shorted inverter 318, both of which are driven by a driver inverter 320. The switchable-shorted inverter 318 may be switched in or out by either turning on or turning off switches 318-1 and 318-2 driven by control signals. The switches 318-1 and 318-2, in one form, may be MOS devices. Each of the programmable gain stages PGA-C also includes a shunt peaking inductor 322 coupled between the fixed shorted inverter 316 and the driver inverter 320.

Figure 3C:
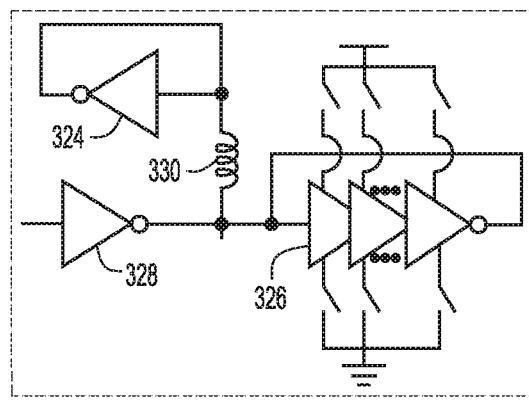
FIG. 3C is a schematic diagram of a fine programmable gain stage, according to an example embodiment.

FIG. 3C shows a schematic diagram of the fine programmable gain stage PGA-F. The fine gain stage PGA-F includes a fixed shorted inverter 324 in parallel with a number of smaller switchable-shorted inverters 326, all driven by a driver inverter 328. As more smaller switchable-shorted inverters 326 are switched in, the effective load resistance 1/g decrease and the gain also decreases. This topology maximizes the achievable linear voltage swing for a given supply voltage. The fine gain stage PGA-F also includes a shunt peaking inductor 330 coupled between the fixed shorted inverter 324 and the driver inverter 328. In all these stages, the transconductance non-linearity of the load partially cancels the non-linearity arising from the driver to improve the overall linearity. Shunt peaking inductors present in all the stages extend their bandwidth at higher gain settings. At lower gains, where the bandwidth is inherently more, the output Q of the load decreases thus preventing any undesirable peaking.

Referring back to FIG. 3A, the first signal path 312 and the second signal path 314 are cross-coupled to each other through a plurality of inverters 332. These cross-coupled inverters 332 between the complementary signal paths 312 and 314 minimize any amplitude and phase mismatch that is applied at the input of the complementary paths 312 and 314.

Figure 3D:
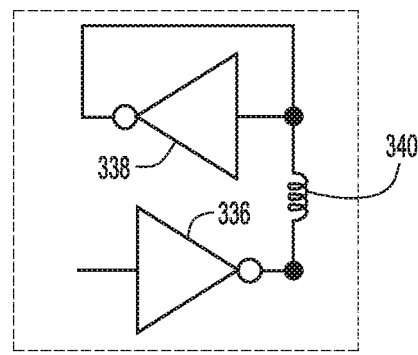
FIG. 3D is a schematic diagram of an output buffer, according to an example embodiment.

The output buffer section 208 is coupled after the PGA section 206. Specifically, the first signal path 312 and the second signal path 314 are coupled to output buffers 334-1 and 334-2, respectively. Reference will now be made to FIG. 3D for a schematic diagram of output buffers 334-1 and 334-2. Each of the output buffers 334-1 and 334-2 includes a driver inverter 336 driving a shorted inverter load 338 to offer, for example, a 50Ω output impedance. Each of the output buffers 334-1 and 334-2 also includes a shunt peaking inductor 340 coupled between the fixed shorted inverter 338 and the driver inverter 336. In some embodiments, the output buffer topology can be used as a voltage mode driver, offering a controlled output impedance like 50Ω and having good bandwidth and linearity in serial transceiver blocks (SERDES). The function of the output buffers 334-1 and 334-2 is to provide a large linear output swing and have a well-controlled output impedance.

As illustrated in FIG. 3A, the entire signal path from the front end section 202 to the output buffer section 208 is composed of DC-coupled inverters operating in the linear region. Using multiples of unit-sized inverters may eliminate systematic offset. In some embodiments, every section starting from the IN converter to the output buffer section 208 is built using a basic CMOS inverter. Each section may use any number of basic CMOS inverter(s) such that, in each section, only the number of the inverters may vary. For example, in the single-to-differential converter 204, the driver INV1 may have 9 units of basic inverters connected in parallel and load INV2 may have 8 units in parallel.

In some embodiments, the TIA 122 further includes a first feedback circuit (DCFB1) 343 coupled between a current source 342 and the output of the second inverter INV2 of the single-to-differential converter 308. The first feedback circuit 210 includes a first resistor 344, a first invertor 346, a first short-circuited inverter 348, a second resistor 350, and a second short-circuited invertor 352, all connected in series. The first feedback circuit 210 is configured to subtract the average value of the photodiode current at the input. The TIA 122 further includes two second feedback circuits (DCFB2) 212(1) and 212(2), one on each of the first signal path 312 and the second signal path 314. Each of the second feedback circuits 212(1) and 212(2) is coupled between an output of the output buffer 334-1 or 334-2 and a first stage of the PGA section 206, i.e., the first coarse PGA (PGA-C) in the signal path. The components of the second feedback circuits 212(1) and 212(2) are similar to those of the first feedback circuit 210 and are therefore not described. The second feedback circuits 212(1) and 212(2) are configured to minimize the random mismatch effects and prevent saturation of the gain stages. The DC feedback loops also use unit-sized inverters and provide a high-pass corner frequency of less than 100 kHz for the signal. Automatic gain control (AGC) provided to the TIA 122 is implemented via firmware by monitoring the A/D converter (ADC) output in the clock and data recovery (CDR) block 124 (FIG. 1).

Traditional TIA designs employing differential pairs have good common-mode and power-supply noise suppression. However, the DC-coupled inverters, such as those employed in the above embodiments, have no such immunity. Therefore, an on-chip programmable linear regulator, that provides isolation from voltage supply and substrate noise, may be provided to power the entire signal path in the TIA 122, forming a dynamic voltage scaling (DVS) scheme. In addition, the DVS scheme according to some embodiments takes into account the process and temperature variations that may affect the performance of the TIA.

Figure 4:
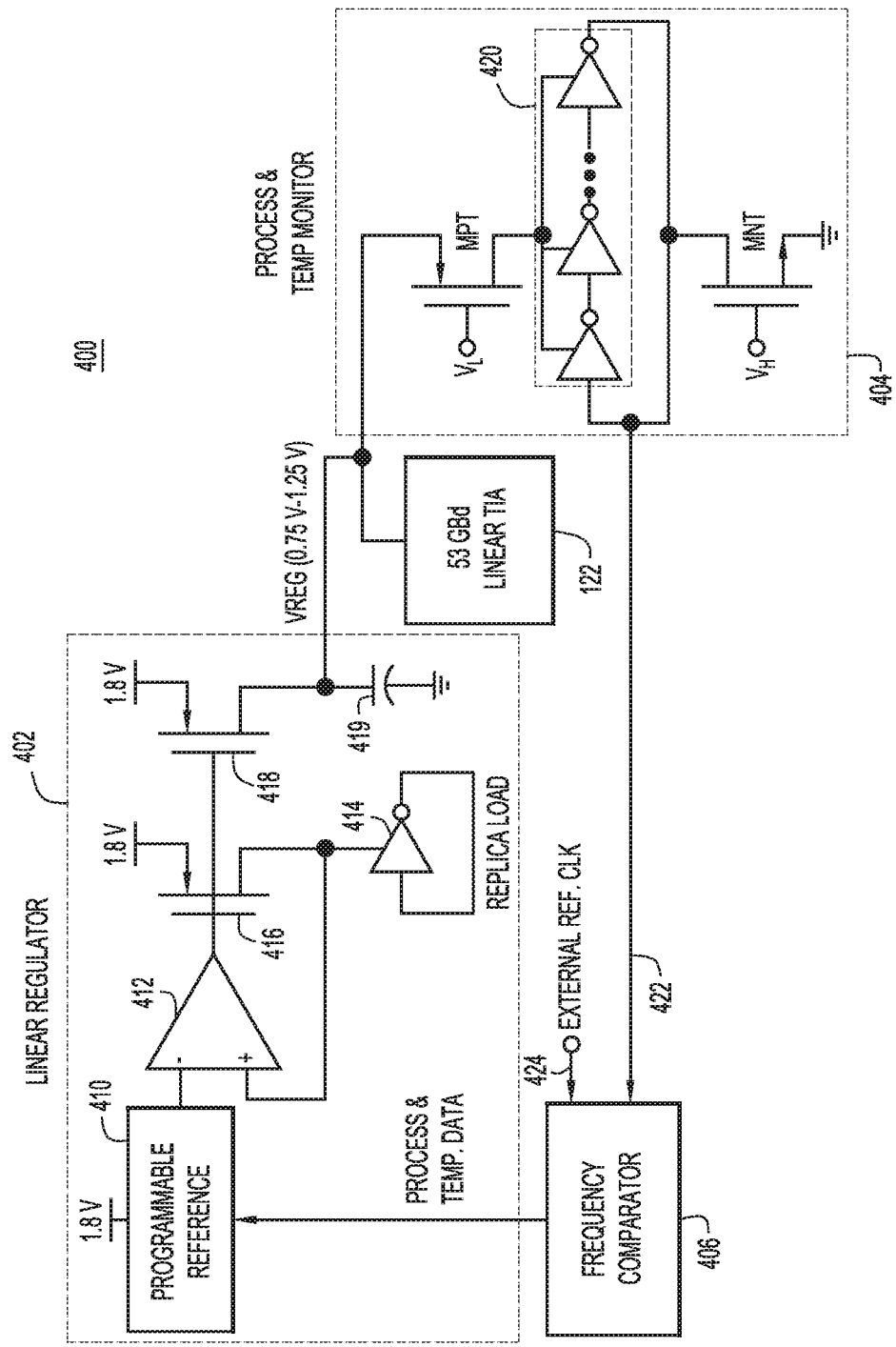
FIG. 4 is a schematic diagram depicting a dynamic voltage scaling circuit for the transimpedance amplifier, according to an example embodiment.

FIG. 4 illustrates a DVS circuit 400 that reduces effects of manufacturing process, input voltage, and temperature variations on a TIA, according to an example embodiment. The DVS circuit 400 includes the linear TIA 122, a programmable linear regulator 402, a process and temperature monitor 404, and a frequency comparator 406. The linear regulator 402 is configured to provide suitable power to the TIA 122 and the process and temperature monitor 404. The linear regulator 402 includes a programmable reference 410, a comparator 412, a replica load 414, two transistors 416 and 418, and a capacitor 419, to regulate output voltage VREG to between 0.75 V and 1.25 V. The programmable reference 410 outputs a control signal to the comparator 412 based on process and temperature data received from the frequency comparator 406. The comparator 412 compares the control signal from the programmable reference 410 with a signal from the replica load 414 and outputs a regulating signal to the transistors 416 and 418 to regulate the voltage suppled to the linear TIA 122. The capacitor 419 is disposed between the regulated output and ground and further improves immunity to the substrate noise.

The regulated voltage adapts to process and temperature variations, thus tightly controlling the bandwidth and peaking of the TIA 122. The linear regulator 402 uses the process and temperature data to regulate the voltage. The process and temperature data is indicative of the process and temperature variations that affects the linear TIA 122. The process and temperature monitor 404 is configured to monitor the process and temperature variations. The process and temperature monitor 404 includes a ring oscillator (RO) 420 and two transistors MPT and MNT to protect the RO from over-voltage.

The range of the regulated voltage is, for example, from 0.75 to 1.25 V across the process, voltage, and temperature (PVT) variations. In this example, the voltage across any two terminals of a transistor may not exceed 0.9 V. The RO 420 made of the same unit-sized inverter as those in the TIA 122 serves as a PVT variations sensor. The RO 420 is used as a process and temperature sensor and has the delay stages built with a number (e.g., 2) of unit inverters. Thus, there is a high degree of correlation between the elements in the TIA 122 and the sensor 420. Hence the regulated supply voltage can be adjusted precisely to within a few millivolts to obtain optimum gain and bandwidth across all process and temperature ranges. Although voltage swing in the TIA 122 is well below rail-to-rail, a ring oscillator swings from rail-to-rail. Thus, the MOS devices in triode region, MPT and MNT, are added to prevent over-voltage. The frequency 422 of the RO 420, which is influenced by process and temperature variations, is compared with a reference clock 424 at the frequency comparator 406. A digital output of the frequency comparator 406 thus represents the process-corner and temperature of the TIA 122. The linear regulator 402 is programmed via a firmware feedback loop to get a targeted RO frequency. An example control algorithm for regulating voltage output to the TIA 122 is shown below:

VTT=0.91V on reset;

Target output of the frequency comparator is 1F1(h) (programmable);

Regulator input is increased/decreased by 1 LSB (8 mV) depending on the output of the frequency comparator;

Repeat the above steps till the output is within a target count (1F1±3) of the desired value (software programmable);

The resolution/range of the comparator can be programmed (desired counter value scales from 1F1 appropriately).

The regulated supply voltage VREG is automatically adjusted for different process corners and temperatures to maximize the bandwidth and minimize any in-band peaking for the TIA 122. In one embodiment, all the transistors in the inverter stages are biased in the saturation region and DVS circuit 400 adjusts their bias point to compensate for variations in mobility and threshold voltage. Thus, with the DVS circuit 400, the transconductance of all the devices in the TIA 122 are tightly controlled across process, voltage and temperature (PVT) variations. Similarly, the output conductance of the triode devices in the feedback path of the front-end section 202 (FIG. 3A) is also tightly bound with similar scheme.

As the TIA performance cannot be fully ascertained at the wafer stage, without the process and temperature tuning, there could be a significant loss of module yield. Discarding assembled modules for any performance shortcoming is very costly. The tuning scheme can also be used to fine tune the quality of the received data eye. According to the techniques disclosed above, the parametric yield of the TIA is expected to be very high as process and temperature variations are automatically compensated to maintain the key performance parameters in a very tight bound.

FIG. 5A and FIG. 5B illustrate TIA transimpedance simulations across a plurality of process and temperature corners, and PGA settings totaling 432 combinations. FIG. 5A shows results of a TIA without DVS circuitry and FIG. 5B shows results of a TIA with DVS circuitry. As illustrated in these figures, the TIA without DVS circuitry has a worse case bandwidth of 10.5 GHz and peaking of 7.2 dB, while the TIA with DVS circuitry has a worse case bandwidth of 26.3 GHz and peaking of 1.4 dB. The effectiveness of the DVS circuitry as disclosed above to tightly control the bandwidth and in-band peaking is clearly demonstrated in FIGS. 5A and 5B.

The basic building block for all the functions of the TIA is a CMOS inverter biased in the linear region of operation. The bias current of such a self-biased inverter is extremely sensitive to PVT variations. Therefore, a DVS scheme is designed to control the key parameters such as bandwidth, voltage swing, and linearity. In addition to providing power supply noise immunity, the adaptive voltage regulator controls the transconductance and output conductance of the MOS transistors to be in a tight bound across PVT variations. This feature makes the TIA or any other circuit using these techniques manufacture-friendly. Even though parameters such as gain, bandwidth, and linearity are very stringent and state of the art, there is no loss of yield in manufacturing due to one or more parameters not meeting the specifications in volume production.

Figure 6A:
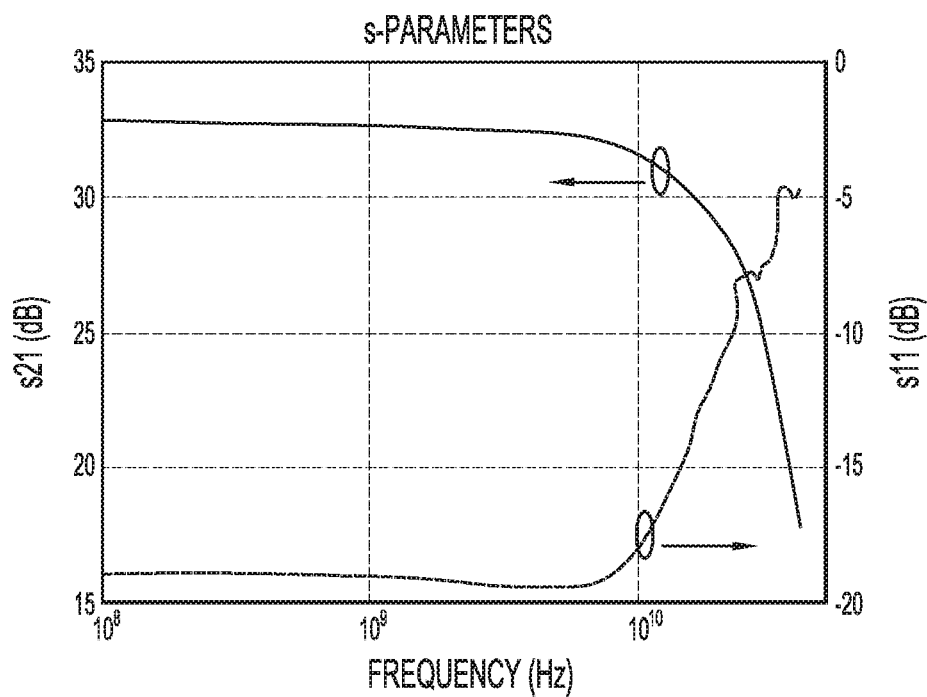
FIGS. 6A-6D are diagrams showing measured small signal parameters of transimpedance amplifiers, according to an example embodiment.
Figure 6B:
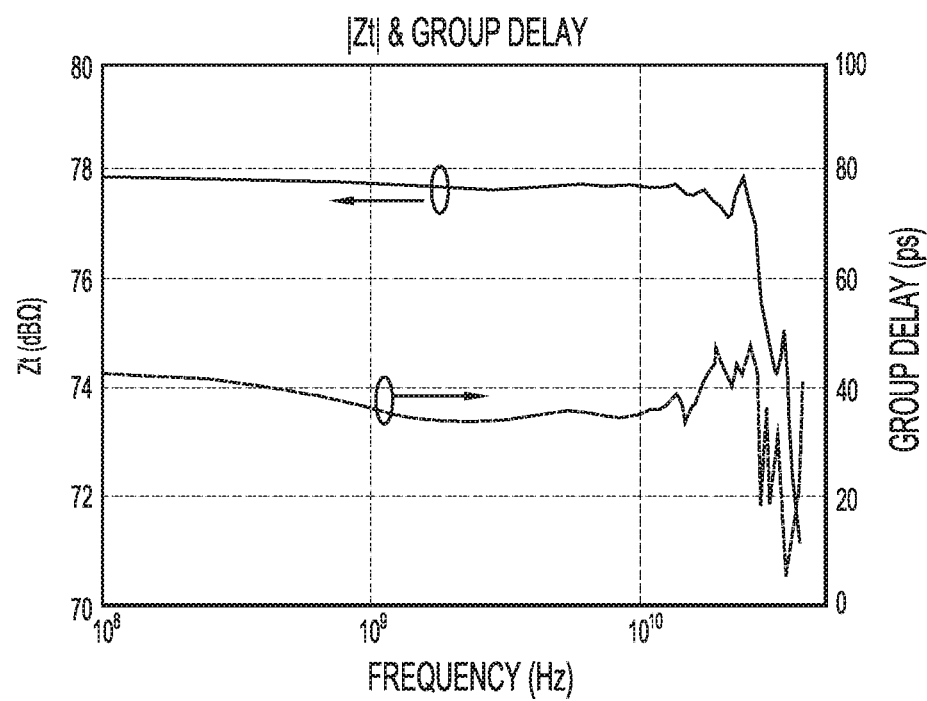
Figure 6C:
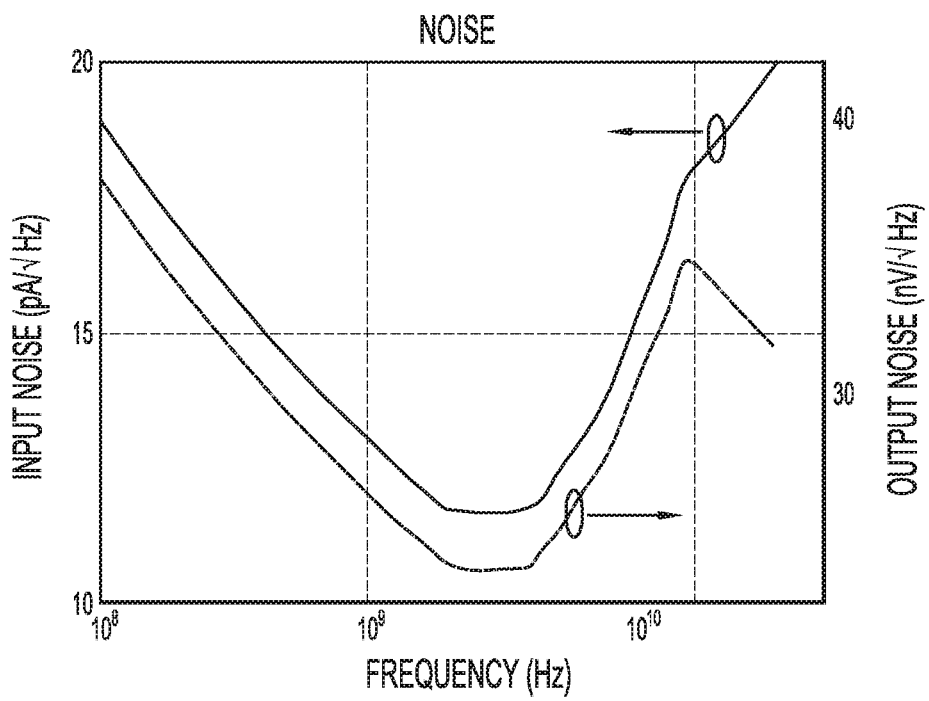
Figure 6D:
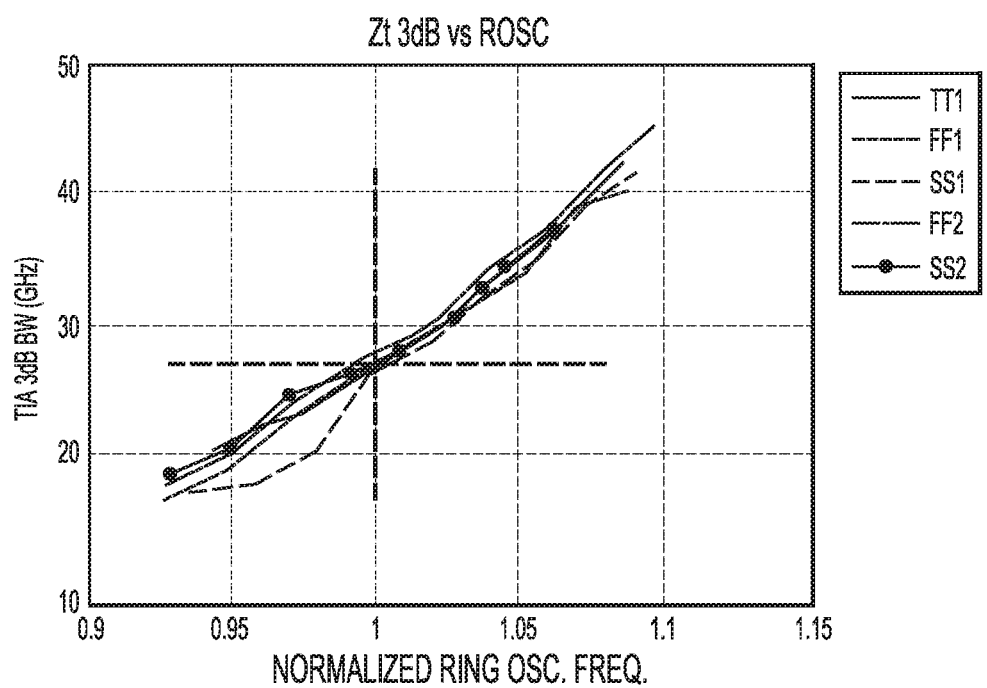

In one example, semiconductor chips containing TIAs consistent with embodiments of the present disclosure are manufactured using a 16 nm fin field effect transistor (FinFET) technology. For making electrical measurements, each of the chips is mounted on a silicon electrical interposer with 50Ω traces and probe-pads for inputs and outputs. For making optical to electrical measurements, each of the chips is mounted on an optical IC such 102. FIGS. 6A-6D illustrates measured small-signal parameters for a gain setting of 78 dBΩ. With the 50Ω environment of the test setup, s-parameters (FIG. 6A) are measured and converted into transimpedance by $Z_t=Z_0 \cdot s_{21}/(1-s_{11})$ (FIG. 6B). The output and input referred noise spectral densities are also shown in FIG. 6C. The average input current noise density is 18.3 pA/√Hz. The bandwidth of the TIA is plotted as a function of normalized RO frequency for 5 samples from typical (TT1), slow (SS1, SS2), and fast lots (FF1, FF2) (FIG. 6D). Excellent correlation between RO frequency and TIA bandwidth is observed, thus validating the DVS scheme.

Figure 7A:
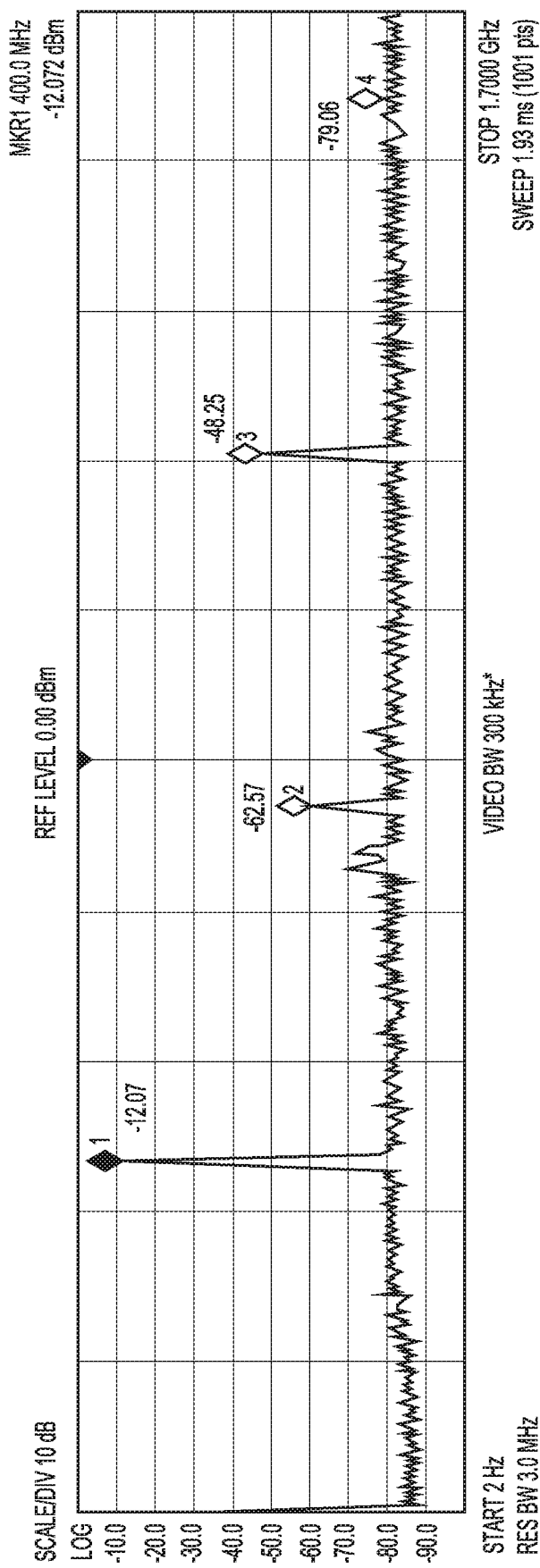
FIGS. 7A-7C are diagrams showing measured large signal parameters of transimpedance amplifiers, according to an example embodiment.
Figure 7B:
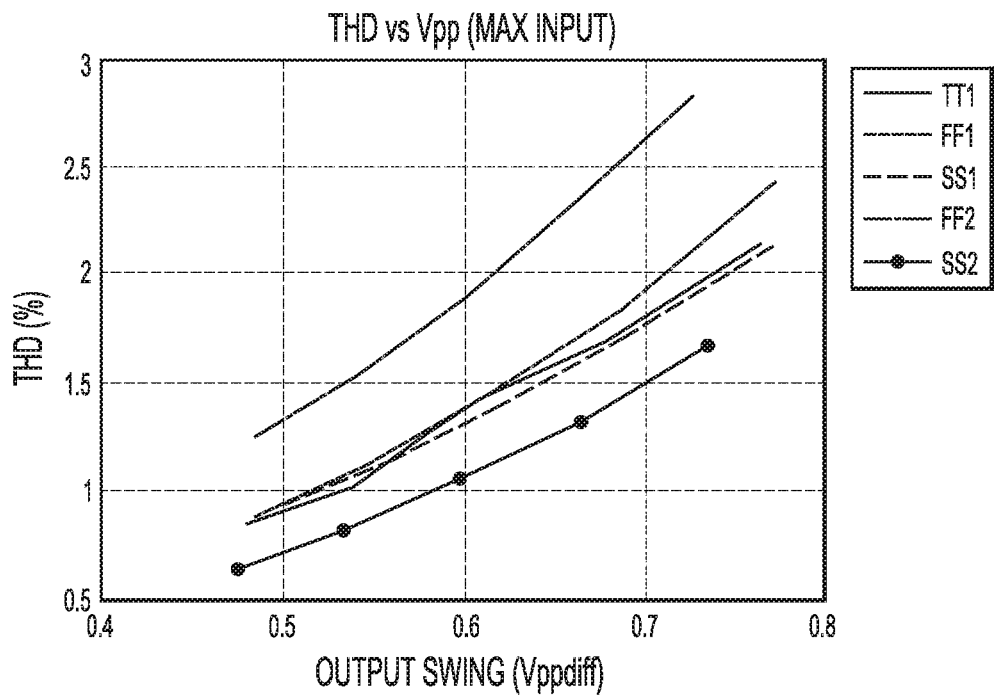
Figure 7C:
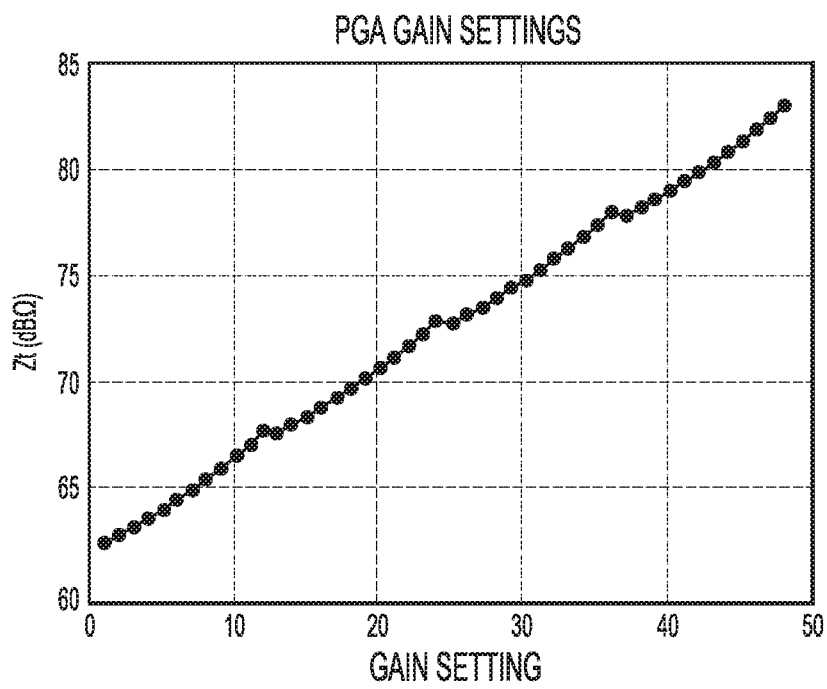

Linearity and gain results of the chip are shown in FIGS. 7A-7C. The spectrum analyzer capture (FIG. 7A) shows the fundamental and harmonics of a 400 MHz sinusoid measured differentially with the help of a balun for an equivalent differential swing of 600 mVpp. Low-level even harmonics indicate well-matched differential branches. Total Harmonic Distortion (THD) vs. signal swing is also presented in FIG. 7B for devices from different process corners. As the DVS mechanism sets a lower supply voltage for fast processes, the THD is slightly higher, but still below 2% for a 600 mVpp swing. The TIA has a gain range of 63 to 80 dBΩ in 0.5 dBΩ steps in order to fill the full-scale range of the ADC, as shown in FIG. 7C.

Referring back to FIG. 3A, the circuit including the complementary signal generator, the PGA section 206, and the output buffer section 208 constitute a voltage-voltage (V/V) converter. Such a V/V converter may be employed in other broadband applications like high-speed analog-to-digital converters, high-frequency filters, etc.

A process and temperature insensitive, low-noise, high gain-bandwidth product, linear TIA for PAM-4 optical links in a low-voltage CMOS process is thus disclosed herein. The linear TIA can be realized in a low-voltage CMOS process that can be integrated with other signal processing functions to provide a low-cost single chip transceiver solution. The parametric yield of the TIA is high due to process and temperature compensations by the DVS scheme. This helps to improve the module yield and lowers cost of manufacture. Based on the techniques disclosed herein, there is no need to skew the process to meet TIA specifications.

The process and temperature compensation scheme can also be used to fine tune the quality of the received eye. A reference clock on the system board may be employed, while a precision voltage such as a bandgap reference is not required. Large signal swing with good linearity can be achieved and results in a good signal-to-noise plus distortion ratio (SNDR) at the output. This eases the thermal noise limit of the A/D converter in the clock-and-data recovery block 124 (FIG. 1) and reduces the power consumption.

In summary, in one aspect, a circuit is provided. The circuit includes a front end section configured to receive input current signals, a programmable gain amplifier section coupled to the front end section, and an output buffer section coupled to the programmable gain amplifier section and configured to output voltage signals. The programmable gain amplifier section includes a plurality of inverters connected in series without a resistor disposed therebetween.

In one embodiment, the front end section includes a shunt-feedback inverter having a feedback structure including metal-oxide-semiconductor devices.

The programmable gain amplifier section may include a plurality of coarse programmable gain stages and a fine programmable gain stage. Each of the coarse programmable gain stages may include: a fixed shorted inverter in parallel with a switchable-shorted inverter; and a shunt peaking inductor coupled in series with the fixed shorted inverter. The fine programmable gain stage may include a plurality of switchable-shorted inverters.

The output buffer section may include a driver inverter and a shorted inverter connected in series, wherein the driver inverter drives the shorted inverter.

The circuit may further include a single-to-differential converter coupled between the front end section and the programmable gain amplifier section and configured to provide differential signals to the programmable gain amplifier section, the single-to-differential converter including at least a first inverter and a second inverter, the first inverter having an input coupled to the front end section and an output coupled to an input of the second inverter, the second inverter having an output coupled to the programmable gain amplifier section, the input and the output of the second inverter being shorted. The programmable gain amplifier section may include: a first signal path having a first plurality of inverters connected in series without a resistor disposed therebetween, wherein the first signal path is coupled directly after the front end section; and a second signal path having a second plurality of inverters connected in series without a resistor disposed therebetween, wherein the second signal path is coupled directly after the single-to-differential converter. The first signal path and the second signal path may be cross-coupled via inverters, thereby reducing amplitude and phase mismatches between signals of the first signal path and the second signal path.

The circuit may further include: a first feedback circuit coupled between a current source of the transimpedance amplifier and the output of the second inverter of the single-to-differential converter; and a second feedback circuit coupled between an output of the output buffer and a first stage of the programmable gain amplifier section.

In another aspect, a device is provided. The device includes a transimpedance amplifier and a programmable linear regulator configured to provide an adjustable voltage to the transimpedance amplifier. The transimpedance amplifier includes a front end section configured to receive input current signals, a programmable gain amplifier section coupled to the front end section, and an output buffer section coupled to the programmable gain amplifier section and configured to output voltage signals. The programmable gain amplifier section includes a plurality of inverters connected in series without a resistor disposed therebetween.

In still another form, a single-to-differential converter is provided. The single-to-differential converter includes at least a first inverter and a second inverter, the first inverter having an input and an output coupled to an input of the second inverter, the second inverter having an output, the input and the output of the second inverter being shorted.

In still another form, an output buffer is provided that includes a driver inverter and a shorted inverter connected in series, wherein the driver inverter drives the shorted inverter.

The above description is intended by way of example only. Various modifications and structural changes may be made therein without departing from the scope of the concepts described herein and within the scope and range of equivalents of the claims.

What is claimed is:

1. A circuit comprising:
    a front end section configured to receive input current signals;
    a programmable gain amplifier section coupled to the front end section, the programmable gain amplifier section including a plurality of inverters connected in series without a resistor disposed therebetween, wherein the plurality of inverters include a plurality of coarse programmable gain stages and a fine programmable gain stage; and
    an output buffer section coupled to the programmable gain amplifier section and configured to output voltage signals.

2. The circuit of claim 1, wherein each of the coarse programmable gain stages includes:
    a fixed shorted inverter in parallel with a switchable-shorted inverter; and
    a shunt peaking inductor coupled in series with the fixed shorted inverter.

3. The circuit of claim 1, wherein the fine programmable gain stage includes a plurality of switchable-shorted inverters.

4. The circuit of claim 1, wherein the output buffer section includes a driver inverter and a shorted inverter connected in series, wherein the driver inverter drives the shorted inverter.

5. The circuit of claim 1, further comprising:
    a single-to-differential converter coupled between the front end section and the programmable gain amplifier section and configured to provide differential signals to the programmable gain amplifier section, the single-to-differential converter including at least a first inverter and a second inverter, the first inverter having an input coupled to the front end section and an output coupled to an input of the second inverter, the second inverter having an output coupled to the programmable gain amplifier section, the input and the output of the second inverter being shorted.

6. The circuit of claim 5, wherein the programmable gain amplifier section includes:

a first signal path having a first plurality of inverters connected in series without a resistor disposed therebetween, wherein the first signal path is coupled directly after the front end section; and a second signal path having a second plurality of inverters connected in series without a resistor disposed therebetween, wherein the second signal path is coupled directly after the single-to-differential converter.

7. The circuit of claim 6, wherein the first signal path and the second signal path are cross-coupled via inverters, thereby reducing amplitude and phase mismatches between signals of the first signal path and the second signal path.

8. The circuit of claim 5, further comprising:
a first feedback circuit coupled between a current source of the circuit and the output of the second inverter of the single-to-differential converter; and
a second feedback circuit coupled between an output of the output buffer section and a first stage of the programmable gain amplifier section.

9. A circuit comprising:
a front end section configured to receive input current signals;
a programmable gain amplifier section coupled to the front end section, the programmable gain amplifier section including a plurality of inverters connected in series without a resistor disposed therebetween; and
an output buffer section coupled to the programmable gain amplifier section and configured to output voltage signals, wherein the output buffer section includes a driver inverter configured to drive a shorted inverter in series with the driver inverter.

10. The circuit of claim 9, wherein the plurality of inverters include a plurality of coarse programmable gain stages and a fine programmable gain stage, and wherein each of the coarse programmable gain stages includes:
a fixed shorted inverter in parallel with a switchable-shorted inverter; and
a shunt peaking inductor coupled in series with the fixed shorted inverter.

11. The circuit of claim 9, wherein the plurality of inverters include a fine programmable gain stage comprising a plurality of switchable-shorted inverters.

12. The circuit of claim 9, further comprising:
a single-to-differential converter coupled between the front end section and the programmable gain amplifier section and configured to provide differential signals to the programmable gain amplifier section, the single-to-differential converter including at least a first inverter and a second inverter, the first inverter having an input coupled to the front end section and an output coupled to an input of the second inverter, the second inverter having an output coupled to the programmable gain amplifier section, the input and the output of the second inverter being shorted.

13. The circuit of claim 12, wherein the programmable gain amplifier section includes:
a first signal path having a first plurality of inverters connected in series without a resistor disposed therebetween, wherein the first signal path is coupled directly after the front end section; and a second signal path having a second plurality of inverters connected in series without a resistor disposed therebetween, wherein the second signal path is coupled directly after the single-to-differential converter.

14. The circuit of claim 13, wherein the first signal path and the second signal path are cross-coupled via inverters, thereby reducing amplitude and phase mismatches between signals of the first signal path and the second signal path.

15. The circuit of claim 12, further comprising:
a first feedback circuit coupled between a current source of the circuit and the output of the second inverter of the single-to-differential converter; and
a second feedback circuit coupled between an output of the output buffer section and a first stage of the programmable gain amplifier section.

16. A circuit comprising:
a front end section configured to receive input current signals;
a programmable gain amplifier section coupled to the front end section, the programmable gain amplifier section including a plurality of inverters connected in series without a resistor disposed therebetween;
an output buffer section coupled to the programmable gain amplifier section and configured to output voltage signals; and
a single-to-differential converter coupled between the front end section and the programmable gain amplifier section and configured to provide differential signals to the programmable gain amplifier section, the single-to-differential converter including at least a first inverter and a second inverter, the first inverter having an input coupled to the front end section and an output coupled to an input of the second inverter, the second inverter having an output coupled to the programmable gain amplifier section, the input and the output of the second inverter being shorted.

17. The circuit of claim 16, wherein the programmable gain amplifier section includes:
a first signal path having a first plurality of inverters connected in series without a resistor disposed therebetween, wherein the first signal path is coupled directly after the front end section; and
a second signal path having a second plurality of inverters connected in series without a resistor disposed therebetween, wherein the second signal path is coupled directly after the single-to-differential converter.

18. The circuit of claim 17, wherein the first signal path and the second signal path are cross-coupled via inverters, thereby reducing amplitude and phase mismatches between signals of the first signal path and the second signal path.

19. The circuit of claim 16, further comprising:
a first feedback circuit coupled between a current source of the circuit and the output of the second inverter of the single-to-differential converter; and
a second feedback circuit coupled between an output of the output buffer section and a first stage of the programmable gain amplifier section.

20. The circuit of claim 16, further comprising a programmable linear regulator configured to provide an adjustable voltage to the circuit.

* * * * *